United States Patent [19]
Maier et al.

[11] Patent Number: 5,345,180
[45] Date of Patent: Sep. 6, 1994

[54] METHOD AND ARRANGEMENT FOR DETECTING SHORT-CIRCUITS IN CIRCUIT BRANCHES OF ELECTRICAL POWER SYSTEM NETWORKS

[75] Inventors: Reinhard Maier, Herzogenaurach; Walter Roethlingshoefer, Erlangen, both of Fed. Rep. of Germany

[73] Assignee: Siemens Aktiengesellschaft, Munich, Fed. Rep. of Germany

[21] Appl. No.: 40,335

[22] Filed: Mar. 30, 1993

[30] Foreign Application Priority Data

Mar. 31, 1992 [DE]  Fed. Rep. of Germany ....... 4210614

[51] Int. Cl.$^5$ ............................................... G01R 31/02
[52] U.S. Cl. ..................... 324/537; 324/500; 324/511; 324/522; 340/650; 361/87
[58] Field of Search ............... 324/500, 511, 522, 523, 324/527, 537; 340/650, 651, 664; 361/87

[56] References Cited

U.S. PATENT DOCUMENTS

| | | | |
|---|---|---|---|
| 3,868,665 | 2/1975 | Treglown | 340/651 |
| 4,012,669 | 3/1977 | Gelfand et al. | 361/87 X |
| 4,384,248 | 5/1983 | Matsuda et al. | 324/51 |
| 4,535,378 | 8/1985 | Endo | 361/87 X |
| 4,674,021 | 6/1987 | Sachs | 361/87 X |
| 4,920,447 | 4/1990 | Peppel | 361/87 X |
| 4,996,625 | 2/1991 | Soma et al. | 361/87 |

FOREIGN PATENT DOCUMENTS

| | | |
|---|---|---|
| 3347209 | 7/1985 | Fed. Rep. of Germany . |
| 3626399 | 2/1988 | Fed. Rep. of Germany . |
| 1069062 | 12/1982 | U.S.S.R. . |
| 1553926 | 2/1988 | U.S.S.R. . |
| 2239530 | 7/1991 | United Kingdom . |

Primary Examiner—Kenneth A. Wieder
Assistant Examiner—Glenn Brown
Attorney, Agent, or Firm—Kenyon & Kenyon

[57] ABSTRACT

According to the present invention, a pulse of short duration is generated from system voltage and is applied to a circuit branch being tested. The resulting current is measured and subjected to a comparative evaluation. The corresponding arrangement has a power semiconductor circuit for generating the testing pulse from the system voltage. Preferably, a so-called GTO (Gate Turn-Off thyristor) is used for this purpose.

15 Claims, 2 Drawing Sheets

METHOD AND ARRANGEMENT FOR DETECTING SHORT-CIRCUITS IN CIRCUIT BRANCHES OF ELECTRICAL POWER SYSTEM NETWORKS

BACKGROUND OF THE INVENTION

The present invention relates to a method for detecting short-circuits in circuit branches of electrical power system networks. A device implementing the method applies a test voltage to the circuit branch being tested and then measures the resulting current. The measured current is then supplied to an evaluation circuit which compares the actual-value to a predetermined setpoint-value.

Circuit-breakers are usually used for switching electrical branches to a system circuit. Existing circuit breakers are most commonly stressed when a short-circuited branch is brought into the system circuit, for example during the initial operation of a defective system. This problem results from the fact that the breaking operation takes place only after the switch has first terminated its closing operation. As a result, the duration of the short-circuit becomes quite considerable. In addition, when a short circuited branch is brought into a circuit, the resistance of the resulting entire circuit becomes very low. As a result of this low resistance, the short-circuit current is high.

The design tolerances of a circuit-breaker, in particular, but also of other operational equipment could be relaxed and, thus, such equipment could be made less expensive if the existence of a short-circuit in the branch could be automatically tested before the branch is connected to the system circuit. If the branch is short-circuited, it could then be prevented from being connected to the system circuit. The duration of such a test must be short enough so that any noticeable closing delay would be avoided, i.e., the duration of such a test must be more or less in the order of magnitude of less than one second.

The German Published Patent Application 36 26 399 discloses an arrangement for influencing, and more particularly for preventing a switching device (preferably a remote-controlled switching device) from closing. The operation of this arrangement depends upon data pertaining to power supply conditions. A separate-source voltage is injected onto a branch being tested. To inject the separate-source voltage, this arrangement provides an impulse generator to generate testing pulses. A downstream evaluation circuit compares an actual-value to a setpoint value and determines the peak value of the converted instantaneous electric power output. Furthermore, the German Published Patent Application 33 47 209 discloses an arrangement for influencing a switching device in which the impedance of the branch is determined and compared to preset values.

The previously known arrangements unequivocally and rapidly find short-circuits, interturn shorts in windings, and breaks in the supply lead. However, these arrangements are not well suited for detecting existing short-circuits in any power system network.

Thus, a method for detecting short-circuits in circuit branches of any power system network is needed as well as a circuit arrangement for implementing the method.

SUMMARY OF THE INVENTION

The present invention meets the above-described need by providing a method of the type mentioned at the outset in that a pulse of short duration is generated from the system voltage rather than from an impulse generator. This pulse is applied to the circuit branch sought to be switched into the system circuit. The resulting current is measured and is subjected to a comparative evaluation. The current measured value is preferably integrated to differentiate a short-circuit from the switching-in of any power consuming device by comparing the integrated current measured value to a comparison value.

To detect the short-circuit, the current measured value is generally evaluated on an analog basis. However, the measured current may also be evaluated after a digitization. This evaluation may be implemented using software and, in particular, a method of pattern recognition may be applied in addition to the digital integration through summation.

In the circuit arrangement for implementing the method of the present invention, a power semiconductor circuit is provided, specifically for generating a testing pulse from the system voltage. This power semiconductor circuit advantageously contains a GTO ("Gate Turn-Off" thyristor), which is triggered for an adjustable duration at the instant of the peak value of the system voltage.

With the present invention, the current integral is used by the evaluation means. The current integral is a unique characteristic in that it allows devices which consume power, such as resistors, motors, capacitors, as well as combinations thereof, to be clearly distinguished from a short-circuit. However, the test duration must be long enough that the current integral of a short-circuit may be distinguished from current integrals of power consuming devices. A 0.5 ms test duration will permit such a distinguishment.

Further details and advantages of the present invention are revealed in the subsequent description of an exemplified embodiment based on the drawings.

DETAILED DESCRIPTION

Figure 1:
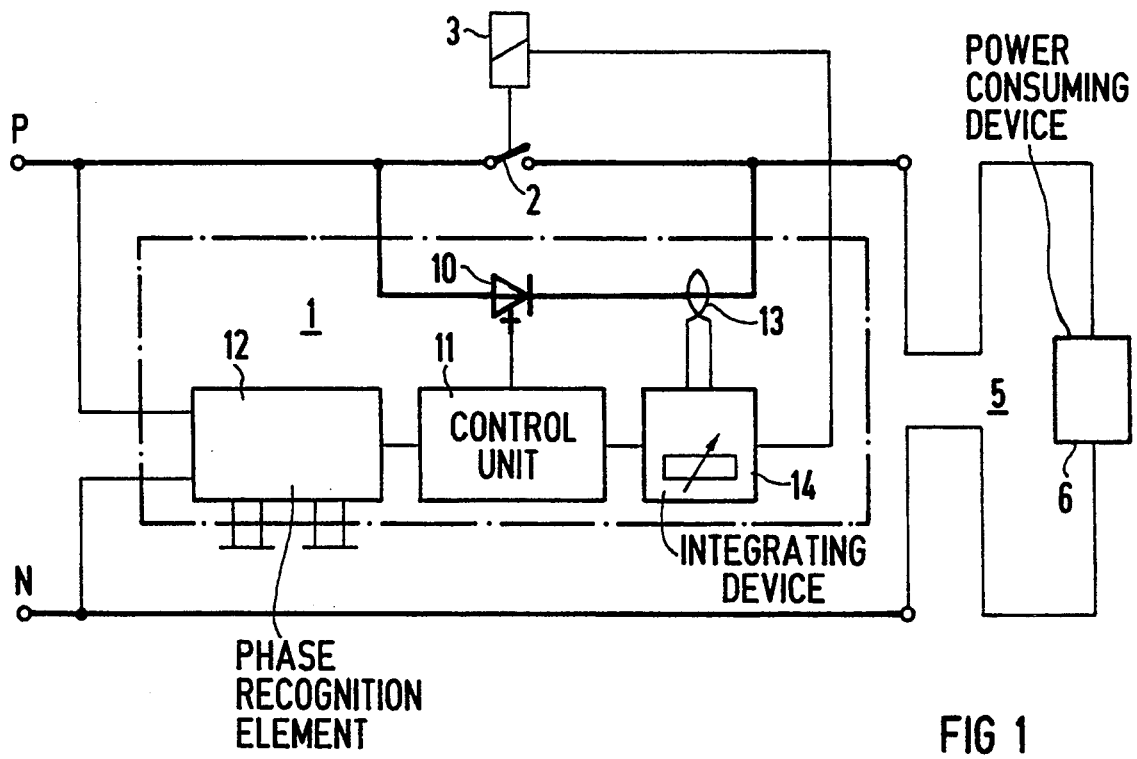
FIG. 1 is a block diagram of an arrangement for implementing a method for detecting existing short-circuits according to the present invention.

FIG. 1 is a block diagram of a circuit arrangement comprising a testing branch 1 and a circuit branch 5 having a device 6 which consumes power, a branch-circuit switch 2, and an operating coil 3 adapted to control the branch-circuit switch 2. The power consuming device 6 can have ohmic or capacitive resistors as well as inductors. In particular, the power consuming device 6 may be a motor.

A thyristor 10, which is designed as a so-called GTO ("Gate Turn-Off" thyristor), is connected in parallel to the branch-circuit switch 2. A control unit 11 is allocated to the GTO 10 for triggering purposes. A recognition element 12 is provided in series with the control unit 11 for determining the phase position of the system voltage while generating switching commands. A current transformer 13 (i.e., a current measuring device) having an integrating (i.e., a current integrating) device 14 is further provided.

Using the specially indicated testing means, the branch-circuit switch 2 may be controlled via the operating coil 3 such that the switch 2 is prevented from being closed when a short-circuit is detected.

The testing pulse is injected onto the testing branch as follows. At the instant of the system voltage's peak value (as recognized by phase recognition element 12), the GTO 10 is triggered (by control unit 11) and is then switched off after a preset duration. Thus, when testing a circuit branch for a short-circuit, a test signal of the correct voltage level is automatically injected onto the circuit branch, namely, the voltage level of the test signal is approximately equal to the peak voltage of the system. Since the current is essentially limited only by the internal resistance of the system, the testing time is very short. For the GTO 10 to be triggered by the control unit 11, the zero crossing of the system voltage is detected in the recognition element 12, and the triggering of the GTO 10 takes place via an adjustable timing element. An additional timing element specifies the pulse duration.

More particularly, with the circuit arrangement illustrated in FIG. 1, a roughly square-wave pulse of approx. 0.5 ms duration is electronically generated by the GTO 10 from the system voltage and is injected onto the branch to be tested. The current transformer 13 is used to measure the resulting current and the integrating device is used to integrate the measured current in the branch being tested. A threshold detector (not shown) is used to compare and distinguish a short-circuit from the switching-in of a power consuming device such as device 6.

Figure 2:
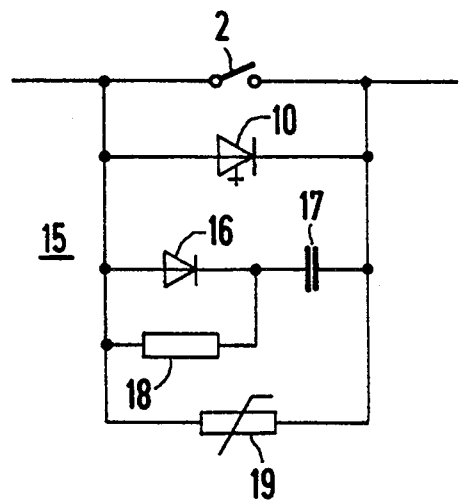
FIG. 2 is a specific suppressor circuit for a "Gate Turn-Off" Thryistor (GTO).

In FIG. 2, a suppressor circuit 15 is allocated to the GTO 10, which is coupled in parallel with the branch-circuit switch 2. The suppressor circuit includes a series connection of a diode 16 and a downstream capacitor 17 coupled in parallel with the GTO 10. An ohmic resistor 18 is provided across the diode 16. This type of suppressor circuit is known as a so-called "snubber circuit". Further, a varistor 19 provided for voltage limitation is coupled in parallel with the diode-capacitor series connection.

Figure 3A:
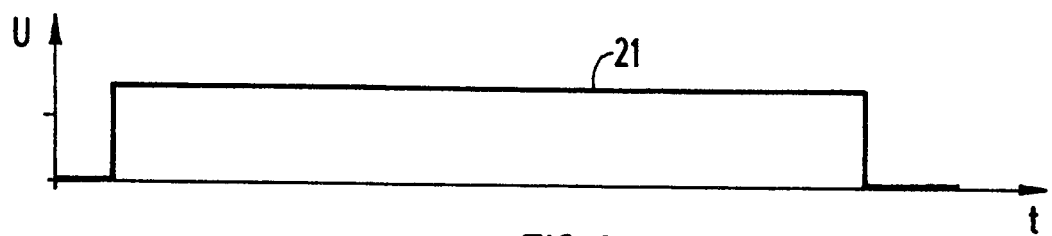
FIGS. 3a–3c are diagrams which illustrate the goal of the present invention, i.e., to discriminate between branches having devices which consume power and short-circuited branches.
Figure 3B:
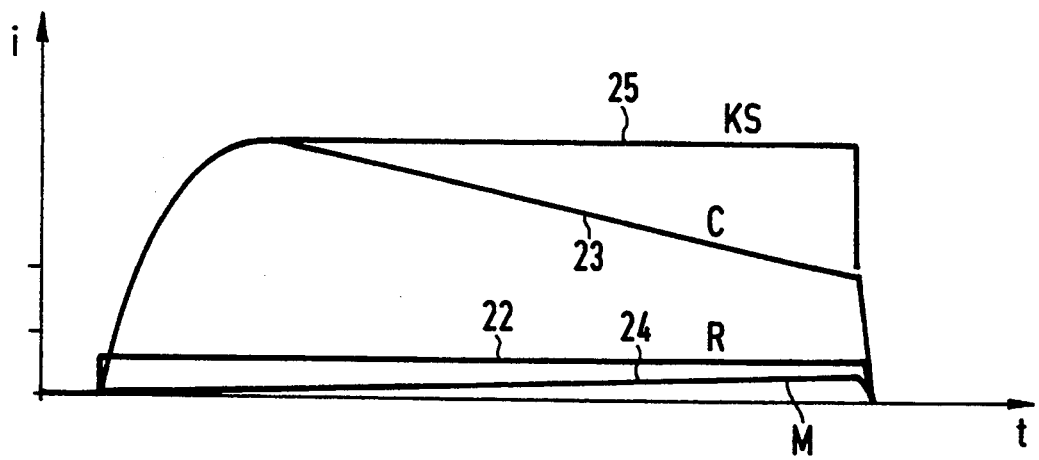
Figure 3C:
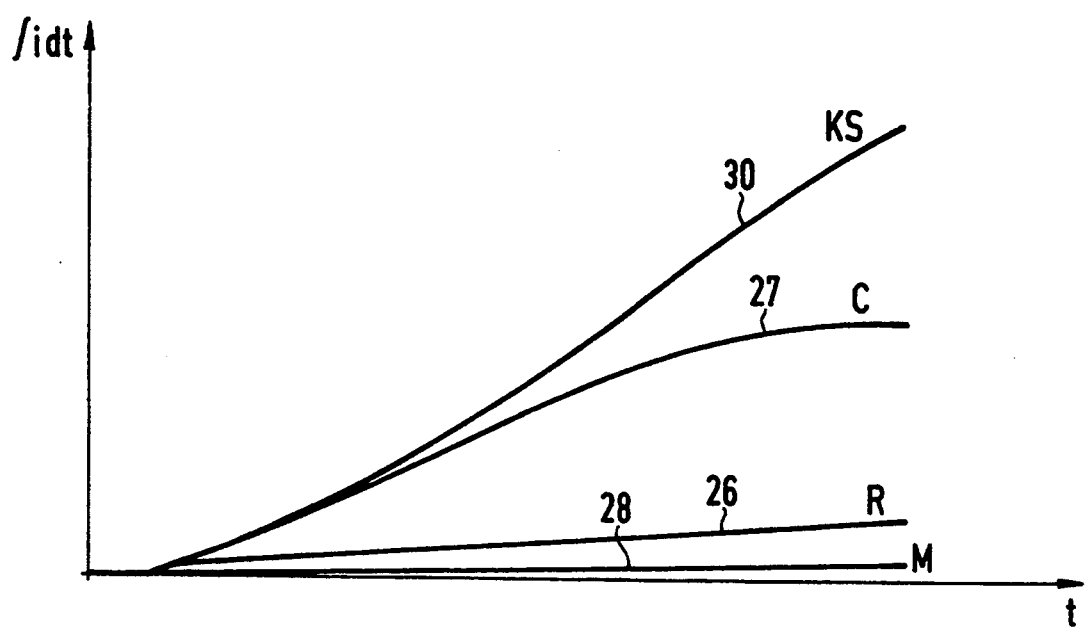

FIGS. 3b and 3c depict the characteristic current and current-integral curves for different power consuming devices. In FIG. 3a, 21 depicts the voltage of the testing pulse. In FIG. 3b, 22 through 24 depict the current characteristic of various power consuming devices. In FIG. 3c, 26 through 28 depict the current-integral signal for the various power consuming devices. In comparison, the characteristic current and current-integral of a short circuit are illustrated by curves 25 and 30, respectively. The current characteristic is predominantly determined by the type of power consuming device in the branch. On the other hand, the voltage is primarily determined by the incoming supply. The internal impedance of the incoming supply only has an inconsequential effect on the current characteristic for power consuming devices which work in the nominal or overload range. On the other hand, in the case of a short-circuit, the internal impedance of the incoming supply determines the current characteristic. The current and current-integral characteristics for power consuming devices R, C and for a motor, which is primarily inductive, are individually depicted for comparison. Short-circuit current and current integral characteristics are also depicted. The power consuming devices are selected such that the maximum permissible current flows in rated operation.

The pattern of the voltage characteristic is more or less the same in all cases. When the power consuming device is a resistor R, the pattern of the resulting current characteristic is rectangular like that of the testing pulse voltage 21 as shown by plot 22. The value for the corresponding current-integral signal rises more or less linearly as shown by plot 26.

Since a capacitor C intermittently acts for a moment as a short-circuit, the current initially rises as shown by plot 23. The rate of the rise is based on the voltage and the total internal inductance. The current then falls off. On the other hand, the current-integral signal as shown by plot 27 increases to an upper range value, which is considerably greater than that of the resistor as shown by plot 26.

When the power consuming device is a motor M, a still smaller current than that in the case of the resistor occurs as shown by plot 24. Likewise, a considerably smaller current-integral value occurs as shown by plot 28.

In the case of a short-circuit KS, the current characteristic is shown by plot 25. Initially, the current characteristic is similar to that of the capacitor. However, rather than dropping off, as occurs with the capacitor, it essentially remains constant. As shown by plot 30, the current-integral signal corresponding to the short circuit KS rises up to an upper range value that is higher than that of all previously described cases.

Thus, FIGS. 3a–3c demonstrate that given different current characteristics, the current integral shows significant variations. Experimental tests have revealed that the current characteristic of branches including resistors and inductors, as well as combinations thereof, such as motors, can be clearly distinguished from the current characteristic of branches having a short-circuit.

Since the current characteristic of a capacitor and of a short-circuit deviate from one another to the smallest degree, they are the most difficult to differentiate. However, the differentiation becomes more marked as the duration of the pulse increases, since the maximum current integral signifies the load stored in the capacitor and is thus finite, while in the case of a short-circuit, the quantity continues to rise as the pulse continues.

Therefore, in the method according to the present invention, the pulse duration should be selected based on the capacitors used in the circuit. Since the capacitors used in practice do not exceed a specified capacitance (e.g., 200 $\mu$F), a pulse duration of 0.5 ms should generally suffice. The latter is especially true when the short-circuit does not occur directly at the location of the power consuming device, but rather at the supply lead. This leads to a higher short-circuit current due to the decreased supply-lead impedance.

A substantially analog measuring method is illustrated in FIG. 1 for current measurement, current integration, and threshold-value comparison. However, the current measured value may also be evaluated digitally. For this purpose, instead of the integrating device 14, a processor is used with an upstream analog-digital converter. In addition to digital integration through summation, such a processor enables a method of pattern recognition to be implemented, in particular, for which suitable software programs are actually available.

What is claimed is:

1. A method for detecting short-circuits in circuit branches of an electrical power system network comprising steps of:
   a) generating a voltage pulse of short duration from system voltage;
   b) applying said voltage pulse generated in step (a) to a circuit branch to be tested;
   c) measuring current resulting from said voltage pulse in the branch to be tested;
   d) supplying the current measured in step (c) to an evaluation circuit; and
   e) comparing said measurement to a setpoint-value.

2. The method according to claim 1, further comprising steps of:
   f) integrating the current measured in step (c);
   g) comparing the integrated current value made in step (f) to a comparison value; and
   h) distinguishing a short-circuit from any power consuming device based on the comparison made in step (g).

3. The method according to claim 1, wherein said voltage pulse generated in step (a) is roughly a square-wave pulse.

4. The method according to claim 3, wherein the square-wave pulse has such a duration that the current-integral characteristic of a maximum permissible capacitor in the circuit branch is distinguishable from a short-circuit branch.

5. The method according to claim 4, wherein when said maximum permissible capacitor has a capacitance of 200 μF, said duration of said square wave voltage pulse is 0.5 ms.

6. The method according to claim 3, wherein said square-wave voltage pulse is electronically generated from the system voltage.

7. The method according to claim 3, wherein the amplitude of said square-wave pulse generated in step (a) is substantially equal to a peak voltage of the electrical power system.

8. The method according to claim 1, further comprising steps of:
   (f) integrating said measurement of current made in step (c) and
   (g) comparing said integration made in step (f) to a comparison value in a threshold detector.

9. The method according to claim 1, wherein said evaluation of said measurement of current made in step (c) takes place digitally with the application of software.

10. The method according to claim 9, wherein an integral formation of said measurement of current made in step (c) is carried out by summing digitized current values.

11. The method according to claim 9, wherein said evaluation of said measurement of current made in step (c) applies a method of pattern recognition.

12. In a power system network having a voltage, a device for testing a candidate branch to be switched into the power system network for a short circuit, said device comprising:
   a) a power semiconductor circuit for generating a test pulse from said voltage of said system network and for injecting said test pulse into said candidate branch;
   b) a measurement device for measuring current in said candidate branch resulting from said injected test pulse; and
   c) a comparator for comparing said current measured by said measuring device with specified limiting values to determine whether said candidate branch is short circuited.

13. The device of claim 12 further comprising a control unit adapted to determine instances of peak values of said voltage of said power system network and being coupled with said power semiconductor circuit,
   wherein said power semiconductor circuit contains a Gate Turn-Off thyristor, said Gate Turn-Off thyristor being triggered for an adjustable time at an instant of the peak value of said voltage of said power system network as determined by said control unit.

14. The device of claim 13, further comprising a suppressor circuit including a Resistor-Capacitor-Diode (RCD) snubber circuit and being allocated to the Gate Turn-Off thryistor for limiting the voltage of the test pulse.

15. The device of claim 13, further comprising a suppressor circuit including a varistor for limiting the voltage across the Gate Turn-Off thryistor.

* * * * *